United States Patent
Geisler et al.

(10) Patent No.: US 8,780,571 B2
(45) Date of Patent: Jul. 15, 2014

(54) INTERPOSER LEAD

(75) Inventors: Karl Geisler, St. Paul, MN (US); Jason Klassen, Minnetonka, MN (US); Michael Woizeschke, Bloomington, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 89 days.

(21) Appl. No.: 13/193,422

(22) Filed: Jul. 28, 2011

(65) Prior Publication Data

US 2012/0026705 A1 Feb. 2, 2012

Related U.S. Application Data

(60) Provisional application No. 61/344,459, filed on Jul. 28, 2010.

(51) Int. Cl.
*H05K 7/00* (2006.01)
*H05K 1/18* (2006.01)

(52) U.S. Cl.
USPC ............ 361/760; 361/807; 361/764; 174/260

(58) Field of Classification Search
USPC ......... 361/772, 773, 774, 776, 783, 803, 809, 361/760; 174/260
See application file for complete search history.

(56) References Cited

U.S. PATENT DOCUMENTS

| | | | |
|---|---|---|---|
| 4,827,611 A | 5/1989 | Pai et al. | |
| 5,294,039 A | 3/1994 | Pai et al. | |
| 6,224,396 B1 | 5/2001 | Chan et al. | |
| 6,832,917 B1 | 12/2004 | Neidich | |
| 6,835,898 B2 | 12/2004 | Eldridge et al. | |
| 6,982,869 B2 * | 1/2006 | Larson | 361/679.32 |
| 7,225,538 B2 | 6/2007 | Eldridge et al. | |
| 7,601,039 B2 | 10/2009 | Eldridge et al. | |

* cited by examiner

*Primary Examiner* — Jayprakash N Gandhi
*Assistant Examiner* — Dion R Ferguson
(74) *Attorney, Agent, or Firm* — Ingrassia Fisher & Lorenz, PC (57) ABSTRACT

An interposer lead provides a connection between an integrated circuit and a circuit board. The interposer lead includes a first leg for interfacing with the circuit board. The interposer lead also includes a second leg disposed generally parallel to the first leg for interfacing with an IC electrical lead extending from the integrated circuit. A connecting portion operatively connects the first leg and the second leg. The interposer lead further includes a lip extending non-parallel from the second leg for limiting movement of the IC electrical lead on the second leg.

19 Claims, 6 Drawing Sheets

INTERPOSER LEAD

CROSS REFERENCE TO RELATED APPLICATION

This application claims the benefit of provisional patent application No. 61/344,459, filed Jul. 28, 2010, which is hereby incorporated by reference.

BACKGROUND OF THE INVENTION

1. Field of the Invention

The present invention relates to electrical leads for interposers. More specifically, the present invention relates to a compliant electrical lead with a landing pad for connecting to the lead of an integrated circuit chip.

2. Description of the Related Art

Electrical interfaces between integrated circuits, e.g., microchips, and circuit board are known. Such interfaces are shown in U.S. Pat. No. 4,827,611 and U.S. Pat. No. 5,294,039. The curved interposer leads described these patents serve as electrically conductive paths between the integrated circuits and the circuit board. The curved interposer leads also form a mechanically compliant interface that withstands the damaging thermal stresses and other mechanical vibrations that degrade and destroy solder joints in previous interfaces. Compliancy is a spring-like characteristic of leads that provides some flexibility under applied pressure to absorb stress but which returns to its original orientation when the pressure is removed.

Figure 1:
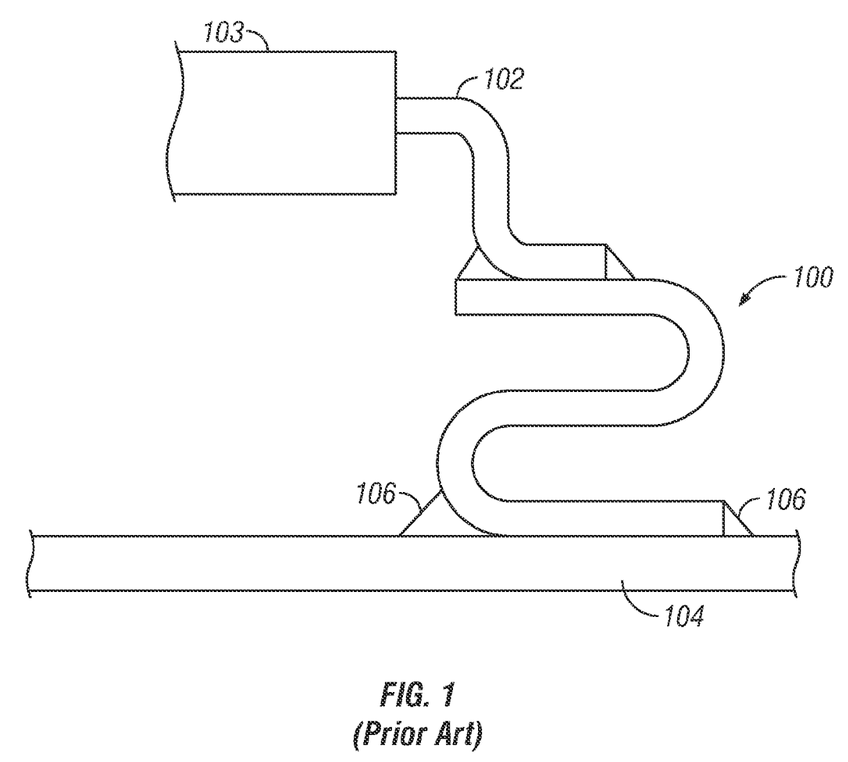
FIG. 1 is a side view of an electronics assembly including a interposer lead according to the prior art connected between an integrated circuit and a circuit board.

The curved interposer leads, such as those described in the above references, often come in "S" and "Z" shapes and provide a flat top "landing area" for the lead of the integrated circuit to connect with. For example, as shown in FIG. 1, the top of an S-shaped interposer lead 100 supports the base of a lead 102 of an integrated circuit chip 103, while the bottom of the S-lead 100 is supported by a circuit board 104. Solder 106 can be applied around the perimeter of the S-lead.

A drawback of these designs is that, with the continual miniaturization of electronic components and corresponding miniaturization of the compliant interposer, it is becoming more difficult to accurately place the leads of the integrated circuit on the top of the interposer lead. Also, the reduction in size also reduces the amount and thickness of solder that can be applied to connect the leads of the integrated circuit to the top of the compliant lead, which directly impacts the lifespan of the solder connection. Components must be able to withstand thermal expansion and contraction cycles over a minimum time period, but a reduction in the amount of solder reduces the number of thermal cycles that the solder can withstand before cracking. This is particularly a problem with ruggedized off the shelf ("ROTS") components, which are in some case required with a 20-year minimum operational rating.

BRIEF SUMMARY

In one aspect of the invention, an interposer lead for providing a connection between an integrated circuit and a circuit board is disclosed. The interposer lead includes a first leg for interfacing with the circuit board. The interposer lead also includes a second leg disposed generally parallel to the first leg for interfacing with an IC electrical lead extending from the integrated circuit. A connecting portion operatively connects the first leg and the second leg. The interposer lead further includes a lip extending non-parallel from the second leg for limiting movement of the IC electrical lead on the second leg.

In another aspect of the invention, an interposer lead for providing a connection between an integrated circuit and a circuit board is disclosed. The interposer lead includes a first leg for interfacing with the circuit board. A second leg is disposed generally parallel to the first leg for interfacing with an IC electrical lead extending from the integrated circuit. The interposer lead further includes a single curved connecting portion having about a 180 degree curvature connecting the first leg the second leg.

BRIEF DESCRIPTION OF THE DRAWINGS

Other advantages of the disclosed subject matter will be readily appreciated, as the same becomes better understood by reference to the following detailed description when considered in connection with the accompanying drawings wherein.

DETAILED DESCRIPTION

Referring to the Figures, wherein like numerals indicate like parts throughout the several views, an interposer lead 10 for an electronics assembly 12 is shown and described herein.

The electronics assembly 12 of the illustrated embodiments includes an integrated circuit ("IC") 14 and a circuit board 16. An IC electrical lead 18 extends from the IC 14 to provide an electrical connection to the IC 14. In practice, a plurality of IC electrical leads 18 extend from the IC 14. However, for the purposes of simplicity, only a single IC electrical lead 18 is shown in each of the Figures.

The interposer lead 10 of the illustrated embodiments serves to mechanically and electrically connect the IC 14 and the circuit board 16. In practice, a plurality of interposer leads 10 may be implemented as part of an overall interposer assembly (not shown) between the IC 14 and the circuit board 16. The interposer leads 10 typically serve, in part, to widen the pitch between the electrical connections of the IC 14 such that convenient electrical connections to the IC 14 may be made via the circuit board 16. Of course, the interposer leads 10 described herein may be used in other electronic and electrical applications as realized by those skilled in the art. Furthermore, for the purposes of simplicity, on a single interposer lead 10 is shown in each of the Figures.

The interposer lead 10 includes a first leg 20 for interfacing with the circuit board 16. The first leg 20 is substantially straight and provides a substantially flat surface 22 for providing the electrical connection with the circuit board 16. The term "substantially" is utilized to illustrate that the first leg 20 need not be perfectly and ideally straight nor the surface 22 of the first leg 20 be perfectly and ideally flat. That is, variances in the straightness of the first leg 20 and the flatness of the surface 22 that do not affect the performance of the first leg 20 are acceptable.

The interposer lead 10 includes a second leg 24 for interfacing with the IC electrical lead 18. The second leg 24 is substantially straight and provides a substantially flat surface 26 for providing the electrical connection with the circuit board IC electrical lead 18. The term "substantially" is utilized to illustrate that the second leg 24 need not be perfectly and ideally straight nor the surface 26 be perfectly and ideally flat. That is, variances in the straightness of the second leg 24 and the flatness of the surface 26 that do not affect the performance of the second leg 24 are acceptable.

The interposer lead 10 further includes a connecting portion 27 operatively connecting the first leg 20 and the second leg 24. In the illustrated embodiments, the connecting portion 27 is curved in a C-shape (as viewed from the side). That is, the connecting portion 27 has an angle α of curvature of about 180 degrees. As such, the connecting portion 27 acts as a spring between the first leg and the second leg 24 and absorbs mechanical stress and shock between the integrated circuit 14 and the circuit board 16, when connected to the first and second legs 20, 24. Said another way, the interposer lead 10 is "compliant".

In the embodiments illustrated in FIGS. 2 through 6, the interposer lead 10 includes a single connecting portion 27. That is, the interposer lead 10 only has one connecting portion connecting the legs 20, 24 in a parallel fashion. By utilizing only a single connecting portion 27, the IC electrical lead 18 is able to be disposed on the second leg 24 without obstruction.

Figure 2:
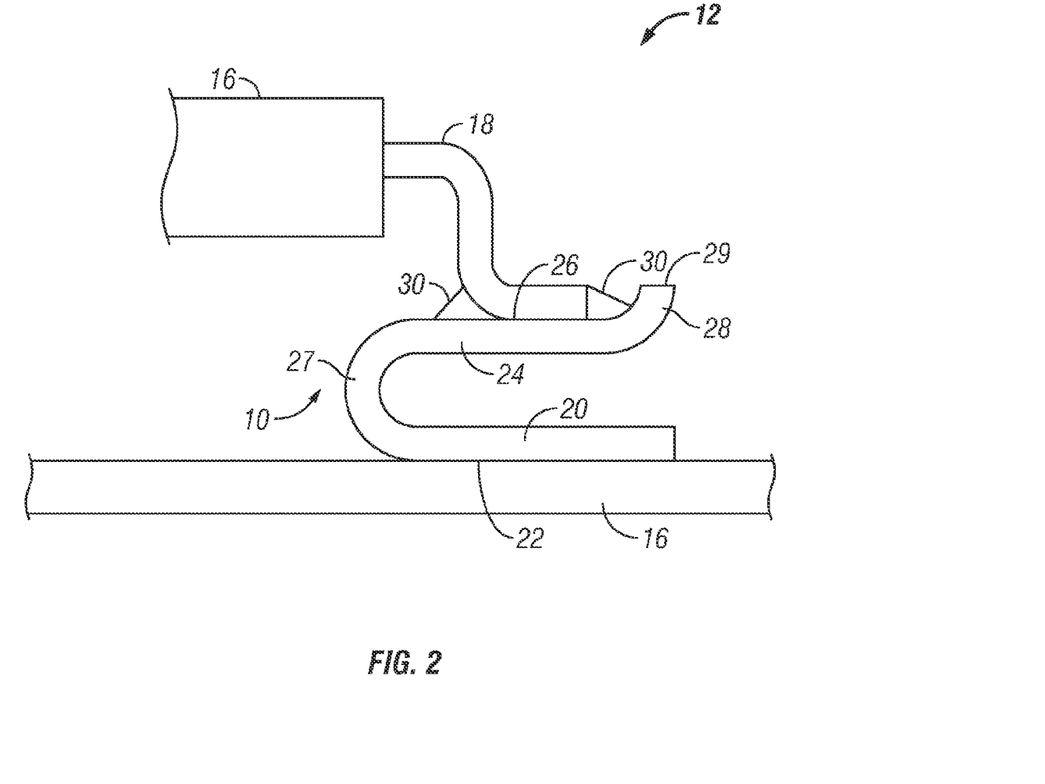
FIG. 2 is a side view of an electronics assembly including an interposer lead according to a first embodiment operatively connecting an integrated circuit and a circuit board.

Referring to FIG. 2, the second leg 24 of the interposer lead 10 is disposed generally parallel to the first leg 20 when in an unstressed state. That is, the legs 20, 24 are generally parallel to one another when forces are not acting to press the legs 20, 24 together or pull them apart from one another. The term "generally" is utilized to illustrate that the second leg 24 need not be precisely parallel to the first leg 20. Instead, the second leg 24 may be at an angle as much as ±20 degrees with respect to the first leg 20.

The interposer lead 10 further includes a lip 28 extending non-parallel from the second leg 24 and terminates at an end 29. The lip 28 limits movement of the IC electrical lead 18 on the second leg 24. That is, the lip 28 prevents the IC electrical lead 18 from sliding off of the second leg 24, thus maintaining electrical contact between the integrated circuit 14 the circuit board 16. The lip 28 also provides a wall (not separately numbered) the accumulation of solder 30. As can be seen relative to the solder in FIG. 1, the lip 28 allows for both more solder 30 in the connection, along with a greater surface area on the second leg 24 to bond with. This configuration increases the number of thermal cycles that the solder 30 can withstand before cracking, which in turn directly bears on the lifespan of the connection between the IC electrical lead 18 and the interposer lead 10.

Figure 3:
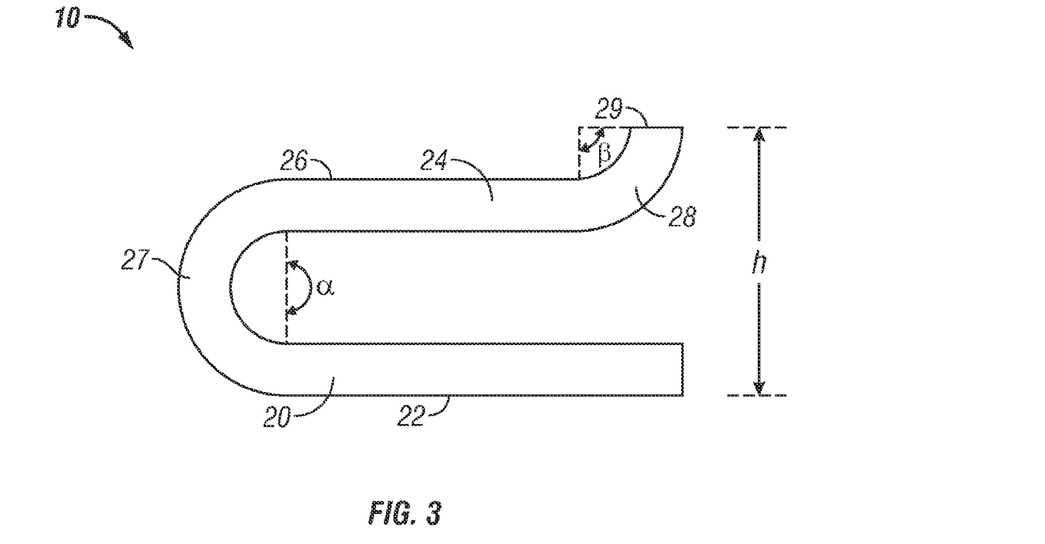
FIG. 3 is a side view of the interposer lead according to the first embodiment.

In a first embodiment, as shown in FIG. 3, the lip 28 is curved. More specifically, the lip curves at least 80 degrees away from the second leg 24. Even more specifically, the lip 28 curves about 90 degrees away from the second leg 24 in a circular arc. The radius of curvature of the lip 28 in the first embodiment is about 0.330 mm with a tolerance of ±0.15 mm. However, any radius of curvature could be used as desired and within mechanical limits of construction. A height h of the interposer lead 10 from the surface 22 of the first leg 20 to a top of the lip 28 is 0.1041 mm±0.15 mm; however, other heights may be used.

Figure 4:
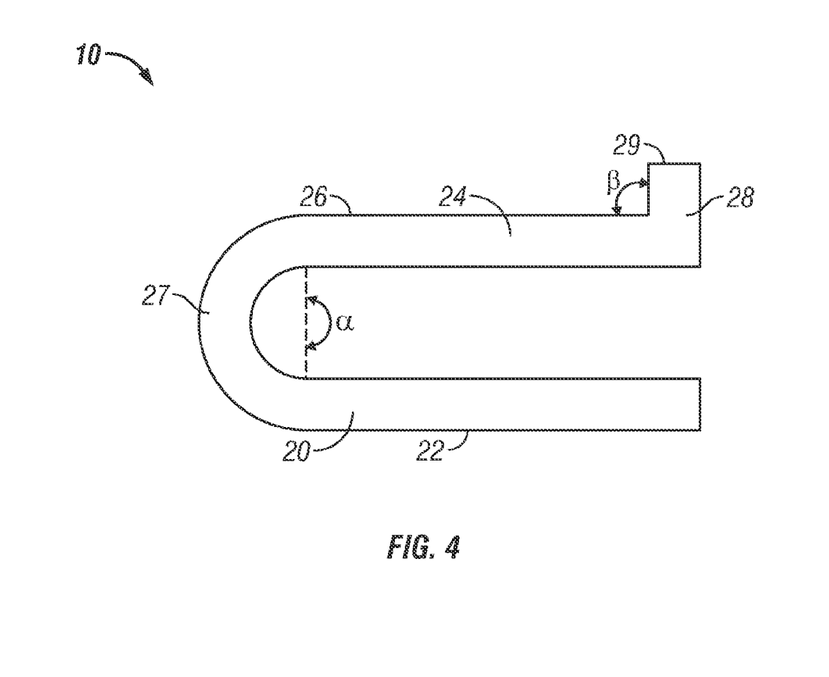
FIG. 4 is a side view of the interposer lead according to a second embodiment.

The lip 28 need not be radially curved in order to limit movement of the IC electrical lead 18 on the second leg 28 and to allow for the accumulation of solder 30. In a second embodiment, as shown in FIG. 4, the lip 28 is not radially curved, but instead extends from the second leg 24 at a right angle. Said another way, the lip 28 of the second embodiment extends at a 90 degree angle from the second leg 24.

Figure 5:
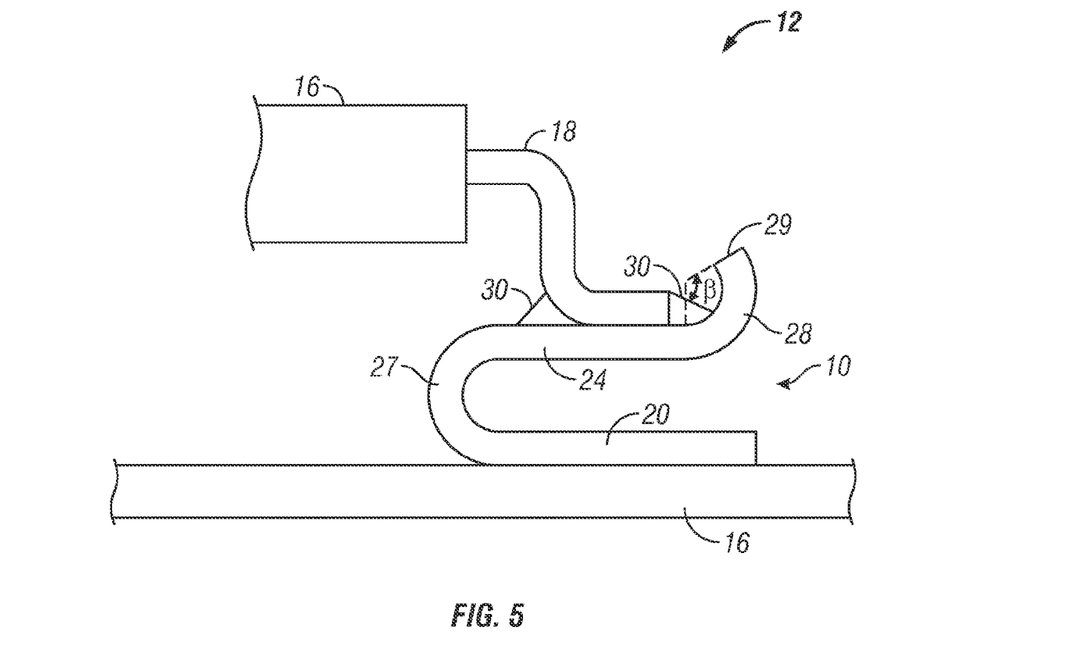
FIG. 5 is a side view of the electronics assembly including the interposer lead according to a third embodiment.
Figure 6:
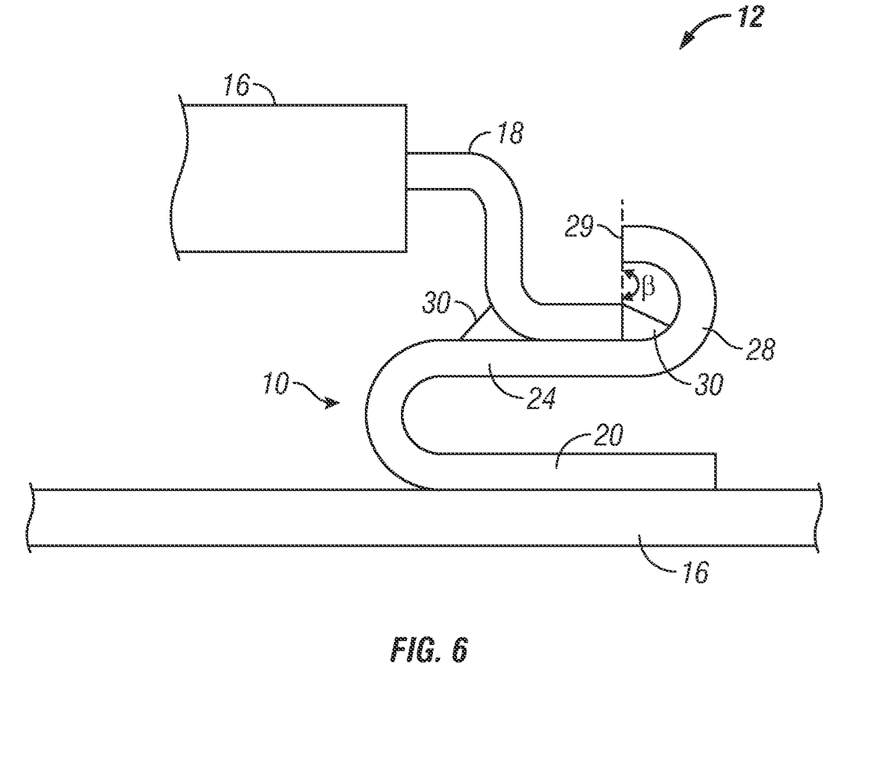
FIG. 6 is a side view of the electronics assembly including the interposer lead according to a fourth embodiment.

In the first and second embodiments described above, the lip 28 does not curve back upon itself. However, some degree of reverse curvature may be tolerated in which the lip 28 continues the curvature path. More specifically, in a third embodiment, as shown in FIG. 5, the lip 28 curves at least 125 degrees away from the second leg 24. Even more specifically, the lip 28 of the third embodiment curves about 135 degrees in a circular arc. In a fourth embodiment, as shown in FIG. 6, the lip 28 curves at least 170 degrees away from the second leg 24. More specifically, the lip 28 of the fourth embodiment curves about 180 degrees in a circular arc. In the third and fourth embodiments, the end 29 of the lip 28 does not extend over the surface 26 of the second leg 24, such that the IC electrical lead 18 may be lowered from directly above without interference from the lip 28. That is, the lip 28 does not obstruct placement of the IC electrical lead 18 onto the second leg 24.

Figure 7:
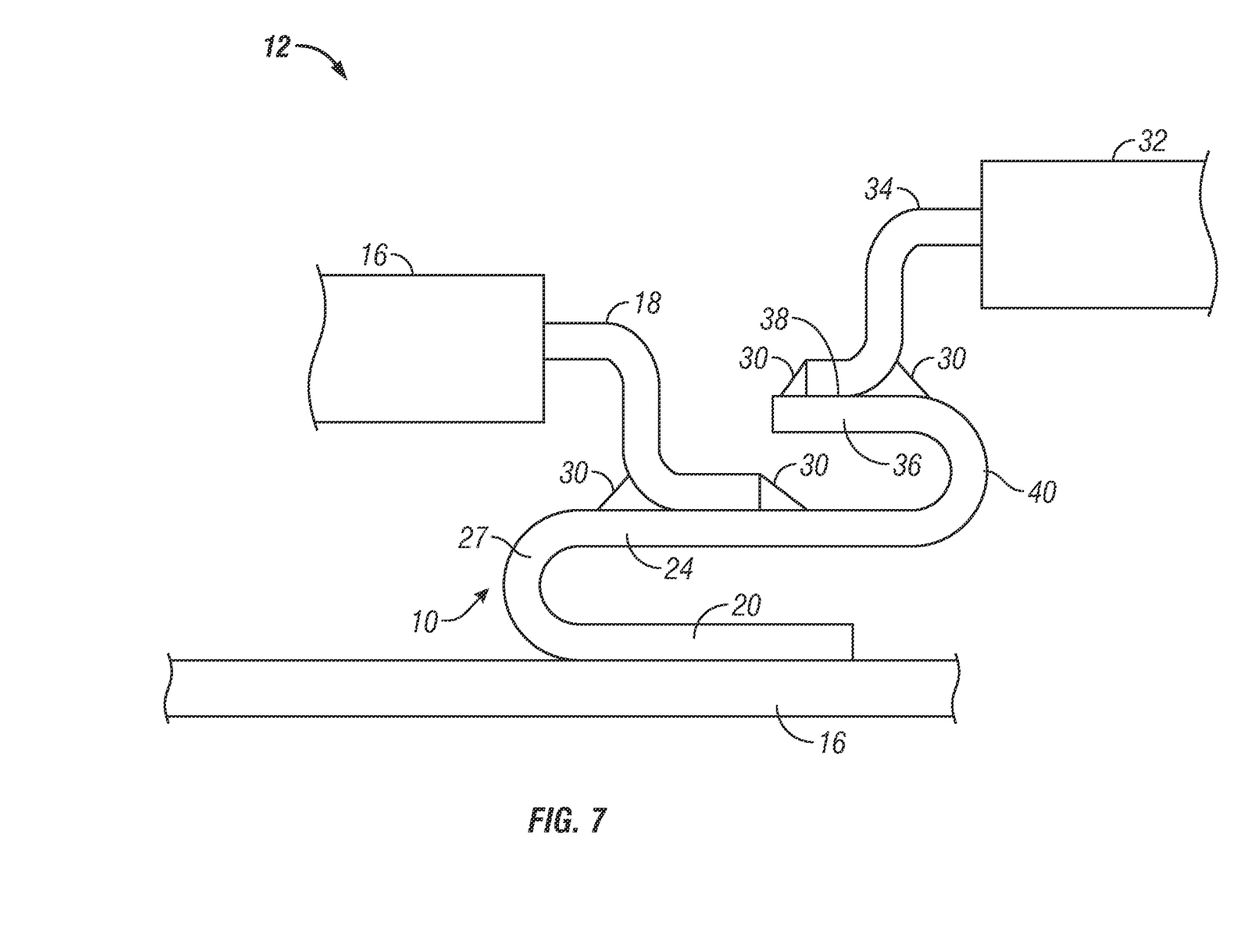
FIG. 7 is a side view of the electronics assembly including the interposer lead according to a fifth embodiment operatively connecting the circuit board, the integrated circuit, and another electronic device.

In a fifth embodiment, as shown in FIG. 7, the interposer lead 10 has a stunted S-shape for allowing connection from the circuit board 16 to the integrated circuit 14 and as an additional device 32. The additional device 32 may be a second integrated circuit (not separately numbered) having a second electrical lead 34 extending therefrom. The interposer lead 10 of the fifth embodiment includes the first and second legs 20, 24 defining the respective surfaces 26, 28. The interposer lead 10 of the fifth embodiment further includes a third leg 36 for interfacing with the second electrical lead 34. The third leg 36 is substantially straight and provides a substantially flat surface 38 for providing the electrical connection with the second electrical lead 34. However, the third leg 36 does not obstruct placement of the IC electrical lead 18 onto the second leg 24.

The interposer lead 10 of the fifth embodiment also includes a second connecting portion 40 operatively connecting the second leg 24 and the third leg 36. The second connecting portion 40 is curved in a C-shape (as viewed from the side). As such, the second connecting portion 40 acts as a spring between the second leg 24 and the third leg 36 and absorbs mechanical stress and shock between the additional device 34 and the circuit board 16.

The interposer lead 10 of the illustrated embodiments comprises a metal. That is, the interposer lead 10 is formed primarily of a metal. Preferably, the interposer lead 10 is made from a layer of copper alloy plated with a lead free solder or a tin/lead solder; however, other suitable materials may alternatively utilized. The preferred copper alloy is about 0.127 mm thick. For example, the copper alloy utilized in some embodiments of the interposer lead 10 may be No. C17410 made in accordance with the ASTM B768 standard. This copper alloy has a hardness of 95-C27R8 and an elongation between 7 to 17 percent. However, those skilled in the art realize that other suitable copper alloys, and in fact other metals and/or other materials, may alternatively be utilized.

It is noted that ASTM B768 is a known specification for a copper-cobalt-beryllium alloy and a copper-nickel-beryllium alloy, strip, and sheet. Heat treating (tempering) of copper alloys changes their strength, elongation, and hardness characteristics. The noted hardness and elongation values specify a certain level of tempering called for in ASTM B768. It would be sufficient to simply specify copper alloy C17410 TH04. Strength is the stress level at which breakage occurs. Elongation is the percentage increase in length (strain) that occurs in a sample under tensile load just before it breaks. Hardness is the resistance to permanent deformation from a small ball or point.

The tin/lead plating of the preferred interposer lead 10 is preferably Sn63/Pb37 made in accordance with standard QQ-S-571, with a matte finish made in accordance with standard MIL-P-81728. The thickness of a copper underplate, which is an intermediate plating layer used to improve adhesion between the base material and the ultimate (external) plating is preferably 0.508 to 0.762 microns, and the solder plate thickness is preferably 20.32 to 30.48 microns. MIL-P-81728 is a known military specification covering requirements for electrodeposited tin-lead plating (workmanship, surface preparation, cleaning, inspection, quality testing, etc.). The copper underplate and solder plating thickness ranges set forth above deviate from the standards of MIL-P-81728.

For the above described embodiments, the solderability requirements preferably meet the requirements of IPC/ECA J-STD-002, currently set forth as of the date of filing at IPC/ECA J-STD-002C. IPC/ECA J-STD-002 is a known commercial standard that prescribes test methods, defect definitions, acceptance criteria, and illustrations for assessing the solderability of electronic component leads. With the tin/lead plating, the details and exceptions to J-STD-002 described in MIL-STD-883, Method 2003.9, currently set forth as of the date of tiling at MIL-STD-883H, shall apply. Solderability refers to the property of a metal to be wetted by solder, where "wetting" refers to the formation of a relatively uniform, smooth, and unbroken film of solder, adherent to the surfaces.

Figure 8:
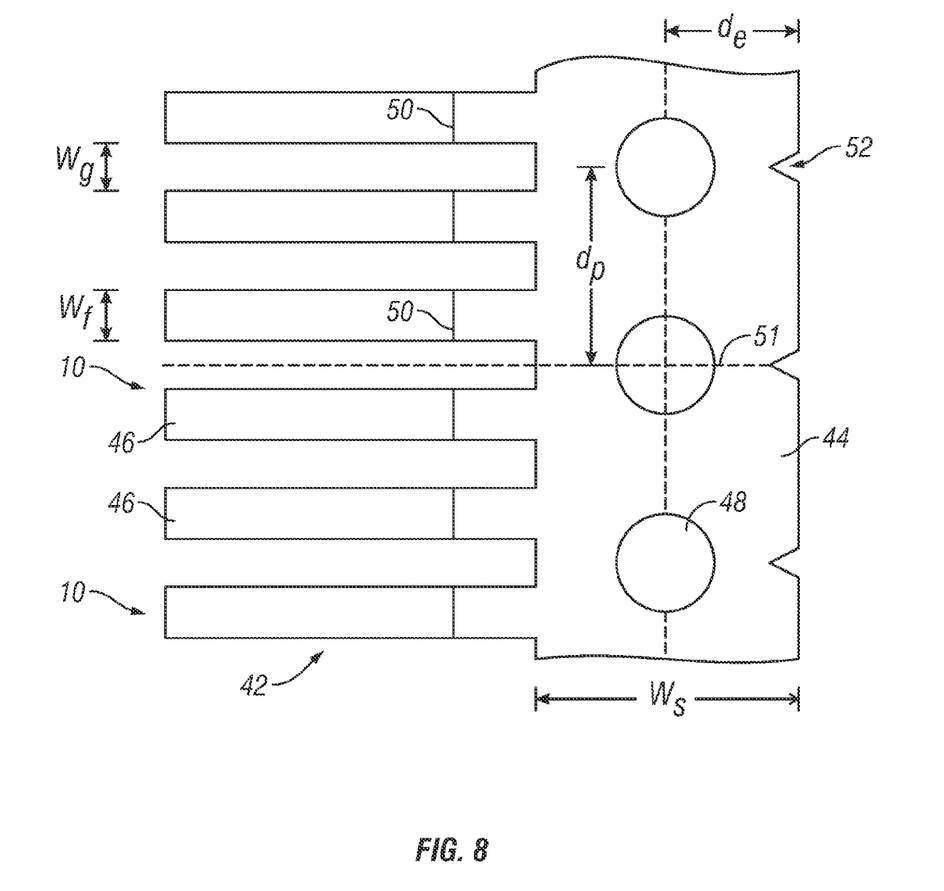
FIG. 8 is a top view of a strip of metal for machining into a plurality of interposer leads.

Referring now to FIG. 8, a plurality of interposer leads 10 constructed in accordance with the embodiments described herein are preferably manufactured in ganged assemblies. An elongated strip 42 of flat metal is progressively fed into a machine which removes material from the strip so that there remains a support strip 44 having spaced flat fingers 46. The support strip 44 defines perforations 48 that can be mounted on a jig (not shown) to hold the leads 10 in spaced relation conforming to the electrical leads 18 on the IC 14.

Each of the fingers 46 can be scored at a score line 50 to facilitate subsequent separation. The portion of each finger 46 beyond its score line 50 is then bent or formed into the desired lead 10 shape. The result is a strip 42 of ganged compliant leads 10, each having a substantially uniform width and thickness.

Other score lines 51 may be interposed between the leads 10 and the support strip 44. The support strip 44 can be severed between any two fingers 46 to obtain gang assemblies containing a desired number of leads 10. Perforations 52 may also be provided on the support strip 44 to facilitate severing.

Each finger 46 width $w_f$ is preferably 0.25 mm, with a 0.25 mm gap $w_g$ between fingers 46. In alternative embodiments, the gap $w_g$ may be 0.15 mm or 0.40 mm. The distance $d_p$ between each perforation 48 is preferably 1 mm center-to-center. Each support strip 44 width $w_s$ is preferably 2.54 mm, and the distance $d_e$ between the edge of the support strip 44 and the center of perforations 48 is preferably 1.27 mm. These preferences are subject to acceptable mechanical tolerances and other distances and widths could be used.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. An interposer lead for providing a connection between an integrated circuit and a circuit board, said interposer lead comprising:
    a first leg for interfacing with the circuit board;
    a second leg disposed generally parallel to said first leg and having a surface for interfacing with an IC electrical lead extending from the integrated circuit;
    a connecting portion operatively connecting said first leg and said second leg; and
    a lip extending non-parallel from said second leg and non-parallel to said first leg for limiting movement of the IC electrical lead on said second leg;
    wherein said lip terminates at an end prior to extending over the surface of the second leg.

2. An interposer lead as set forth in claim 1 wherein said lip is curved.

3. An interposer lead as set forth in claim 2 wherein said lip curves at least 80 degrees away from said second leg.

4. An interposer lead as set forth in claim 2 wherein said lip curves at least 125 degrees away from said second leg.

5. An interposer lead as set forth in claim 2 wherein said lip curves at least 170 degrees away from said second leg.

6. An interposer lead as set forth in claim 1 wherein said lip is generally perpendicular with said second leg.

7. An interposer lead as set forth in claim 1 wherein said connecting portion is curved and said connection portion curves by about 180 degrees.

8. An interposer lead for providing a connection between an integrated circuit and a circuit board, said interposer lead comprising:
    a first leg for interfacing with the circuit board;
    a second leg disposed generally parallel to said first leg and having a surface for interfacing with an IC electrical lead extending from the integrated circuit;
    a connecting portion operatively connecting said first leg and said second leg; and
    a lip extending non-parallel from said second leg, terminating at an end prior to extending over the surface of the second leg, and defining an interior curve with respect to said second leg, wherein said interior curve limits movement of the IC electrical lead.

9. An interposer lead as set forth in claim 8 wherein said lip curves at least 80 degrees away from said second leg.

10. An interposer lead as set forth in claim 8 wherein said lip curves at least 125 degrees away from said second leg.

11. An interposer lead as set forth in claim 8 wherein said lip curves at least 170 degrees away from said second leg.

12. An interposer lead as set forth in claim 8 wherein said lip is generally perpendicular with said second leg.

13. An electronics assembly comprising:
    an integrated circuit;
    an IC electrical lead extending from said integrated circuit;
    a circuit board; and
    an interposer lead electrically connected to said IC electrical lead of said integrated circuit and said circuit board, said interposer lead including a first leg interfacing with said circuit board,
a second leg disposed generally parallel to said first leg and interfacing with said electrical lead,
a connecting portion operatively connecting said first leg and said second leg, and
a lip extending non-parallel from said second leg; and
solder accumulated between said lip and said IC electrical lead;
wherein said IC electrical lead extends above said lip with respect to said second leg.

14. An electronics assembly as set forth in claim 13 wherein said lip is curved.

15. An electronics assembly as set forth in claim 14 wherein said lip curves at least 80 degrees away from said second leg.

16. An electronics assembly as set forth in claim 14 wherein said lip curves at least 125 degrees away from said second leg.

17. An electronics assembly as set forth in claim 14 wherein said lip curves at least 170 degrees away from said second leg.

18. An electronics assembly as set forth in claim 13 wherein said lip is generally perpendicular with said second leg.

19. An electronics assembly as set forth in claim 1 wherein said lip curves less than 170 degrees away from said second leg.

* * * * *